United States Patent

[11] 3,634,602

[72] Inventors Karl vom Bruck
Kassel, Germany;
[21] Appl. No. 28,413
[22] Filed Apr. 14, 1970
[45] Patented Jan. 11, 1972
[73] Assignee Licentia Patent-Verwaltungs-G.m.b.H.
Frankfurt am Main, Germany
[32] Priority Apr. 17, 1969
[33] Germany
[31] P 19 19 421.9

[54] MULTILAYER CONDUCTOR SHEET
11 Claims, 3 Drawing Figs.

[52] U.S. Cl. .......... 174/68.5, 29/625, 317/101 CE
[51] Int. Cl. .......... H05k 1/04
[50] Field of Search .......... 174/68.5; 317/101 R, 101 B, 101 CM, 101 CE; 339/18 R, 18 C, 17 M, 17 R; 29/625–626, 628

[56] References Cited

UNITED STATES PATENTS 2,889,532 6/1959 Slack .......... 317/101 CE UX
2,932,772 4/1960 Bowman et al. .......... 317/101 CE
3,408,452 10/1968 Ruehlemann .......... 317/101 CE X

*Primary Examiner*—Darrell L. Clay
*Attorney*—Spencer & Kaye

ABSTRACT: A flat, multilayer conductor sheet having a plurality of bonded or laminated layers of resin impregnated layers of material. At least one of the layers of material is provided with a plurality of parallel conductors extending in a first direction and at least another of the layers of material is provided with a plurality of parallel conductors extending in a direction transverse to the first direction so that a grid pattern of conductors is formed. Preferably a plurality of layers of material having conductors extending in a direction transverse to the first direction are provided with the conductors in the plurality of layers of material being all parallel to one another and arranged such that they do not overlie one another. Connections between the conductors extending transverse to one another are provided by forming vertical bores through the sheet which intersect the two conductors after which the bore is metallized so that a multiplanar conductor pattern may be formed. Vertical bores through the multilayer sheet may also be provided to interrupt or divide one of the conductors.

Inventor:
Karl vom Bruck
BY Spencer & Kaye
ATTORNEYS.

MULTILAYER CONDUCTOR SHEET

BACKGROUND OF THE INVENTION

The present invention relates to a multilayer conductor sheet or plate which can be provided, in the manner of printed circuits, with a conductive pattern disposed in a plurality of planes.

Various methods of producing printed circuits are well known in the art. For example, conventional printed circuits are usually made of copper-laminated carriers of an insulating material with the current paths being produced, by etching out the undesired portions of the copper laminate or foil.

According to another method for producing printed circuits, the conductive paths are constructed according to the so-called additive method, where the conductive paths are electroplated onto a carrier body which has not previously been laminated with a metal foil. The materials employed for the carrier of such printed circuits are, for example, hard paper or glass-hard fabrics.

It is additionally known to produce printed circuits in which the circuit patterns are disposed in a plurality of planes of a multilayer material.

Finally, single-layer fabric circuits have been produced which permit automatic fabrication. According to this technique, bare wires are woven together with dielectric strands or threads into a pattern forming the desired circuit scheme. Depending on the arrangement of the bare wires, connections may be provided at the intersections of two wires in the fabric by contact therebetween. Such connections produced merely by contact leave much to be desired.

It is accordingly the object of the present invention to provide a multilayer sheet or plate in which conductive patterns can be provided in a plurality of planes in order to realize the best possible volume utilization of the insulating material for the circuit and to assure simple contact formation. It is a further object to produce a multilayer plate which permits the automatic manufacture of the circuitry, particularly with electromechanical devices which are controlled, for example, by programmed memory devices.

SUMMARY OF THE INVENTION

The above objects are achieved according to the present invention by providing a multilayer conductor sheet or plate which comprises a plurality of layers of resin impregnated material which are fused or bonded together into a laminated structure. At least one layer of material is provided with a plurality of parallel conductors extending in a first direction, which conductors form a grid pattern with a plurality of parallel conductors extending in a direction transverse to the first direction and disposed in one or a plurality of further layers disposed on top of one another. The utilization of this configuration of the conductor pattern according to the present invention in the multilayer conductor sheet permits advantageous planning and automatic fabrication of an entire printed circuit.

Instead of using a sheet having only two layers, preferably, according to a further embodiment of the invention, the multilayer sheet contains parallel conductors extending in one direction in a plurality of layers of material with the conductor being disposed such that when the layers of material are disposed one on top of the other, the conductors form a pattern of consecutive, parallel conductors extending in one direction and not overlying one another in the planes. These multilayer or multiplanar conductors form a grid pattern with the plurality of parallel conductors extending in a direction transverse thereto in a further layer bonded thereto.

The individual layers of resin impregnated material in the multilayer sheet serve as the carrier bodies for the conductors, and organic and/or inorganic materials may be utilized as the carrier layer materials. For example, fabrics may be used for the construction of the layers in which the conductors are woven as the warp or filling thread. The individual layers forming the various planes of the multilayer laminated sheet structure then contain conductors which extend in only one direction in the fabric and which may consist of either insulated or noninsulated conductors. The individual layers of conductors are insulated from one another by the binder impregnation of the layer carrier material. A contact formation for the individual directions of the conductors can be produced by direct working, such as is mechanically done for normal printed circuit plates, e.g., metallized boreholes contacting the conductors, as well as chemically for materials containing catalysts. Instead of weaving the conductors into the fabric, the parallel conductors may also be applied to the carrier material at a later time.

For certain applications it may be advisable to dispose the parallel conductors extending in one direction so that they do not form a right angle with the conductors extending in a direction transverse thereto, but rather at some other angle so that an oblique grid or raster pattern is formed between the conductors of the individual layers.

The supporting bodies or layers of carrier material may be laminated materials in the form of glass or mixed woven fabrics employing organic and/or inorganic fibers, or threads. Additionally paper, fleece materials or foils may be used. The binders may preferably be hardenable resins, particularly epoxy resins having suitable other resin components.

The individual layers may be produced in any know manner, advantageously by means of program-controlled machines, and the conductor arrangement in the layer so selected that the conductors are insulated from one another by a dielectric material, e.g., the impregnating resin. Additionally, it is also possible to utilize insulated conductors in the individual layers of material. Moreover, for certain constructions, it may be necessary or advantageous to provide at least one intermediate layer of insulating material between the conductor bearing layers.

According to a further feature of the present invention the impregnating means and/or the insulating intermediate layer are provided with catalysts which, when released following the formation of a bore therethrough effects a sensitizing of the bore wall so that a metal may be deposited without requiring the use of electrical current. In such a construction it is particularly easy to provide contacts through the entire system and thus provide the contacts for the circuit.

A coating layer containing catalysts may also be provided on the surface of the sheet to assure sufficient adhesion with the carrier material for metallically conductive patterns to be applied.

According to another feature of the invention the spacing of the parallel conductors in the various layers is preferably selected so that is is possible to place a vertical bore through the entire sheet to interrupt a conductor train between the conductors in a layer of the sheet. In the multilayer conductor sheets provided with a multiplanar conductor pattern, bores can thus be provided in such a manner that at least one conductor train is interrupted. Such a bore may then be filled with a dielectric material.

DESCRIPTION OF THE INVENTION

Figure 1:
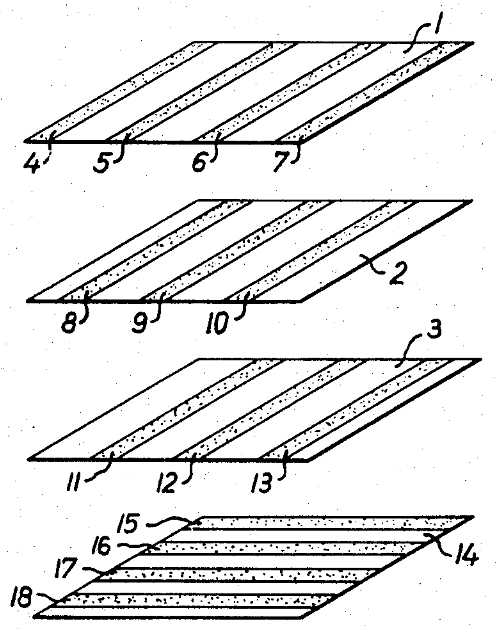
FIG. 1 is an exploded perspective view of a multilayered conductor sheet according to the invention.
Figure 2:
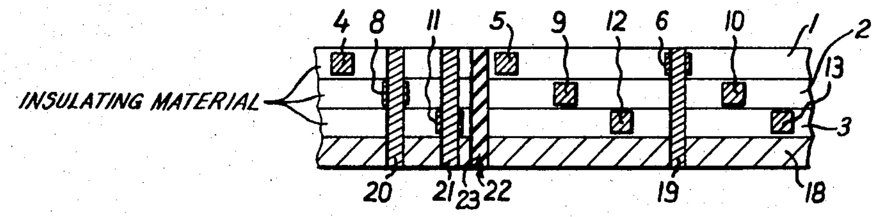
FIG. 2 is a side elevation view, partially in section, of the multilayered conductor sheet of FIG. 1 illustrating the bores formed therein for providing connections and interruptions for the conductors.

Referring now to FIGS. 1 and 2 there is shown a plurality of resin impregnated layers of material 1, 2 and 3 which may for example be formed from a fabric. Each of the layers 1, 2 and 3 is provided with a plurality of parallel conductors 4–7, 8–10 and 11–13 respectively. As indicated the conductors 4–13 are all parallel to one another and the conductors of the various layers are arranged such that they do not overlie one another when the layers 1–3 are aligned and bonded together, i.e., a vertical plane through the layers 1–3 and parallel to the conductors contains only one of the conductors 4–13. Mounted on or contained within a further layer of material 14 is a further plurality of parallel conductors 15–18 which extends in a direction transverse to the direction of the conductors 4–13. The individual layers 1–3 and the layer 14, which serves as a support for the construction of the multilayer sheet, are impregnated with a hardenable binder, e.g., an epoxy resin, and are bonded together by the application of pressure and heat to form the multilayer conductor sheet.

Connections between the conductors in the various layers 1–3 and 14 are provided by means of metallized vertical bores formed through the entire sheet. Such a bore is shown, e.g., at 19 in FIG. 2 which after metallization will form a contact between the conductor 6 in the upper layer 1 and the conductor 18 in the lower support layer 14. Similarly the bores 20 and 21, after metallization, will provide contact between the conductor 18 and the conductors 8 and 11 respectively. Similar bores (not shown) can be provided where desired to provide connections between the conductors 4–13 and conductors 15–17.

In order to provide greater flexibility and usage of the total conductor areas, as indicated above the spacing of the conductors 4–13 is such that a vertical bore can be passed through the layers 1–3 without passing through any of the conductors therein. Such a bore is shown, e.g., by the reference numeral 22 in FIG. 2. By utilizing such a bore and positioning it such that it interrupts or divides the conductor 18 in two sections, the conductor 18 may now be utilized in two different multilayer conductor patterns, i.e., one containing a connection to the conductor 6 and the other containing connections to the conductors 8 and 11. No connection however exists with this configuration between conductors 6 and 8, thus in effect increasing the number of transversely extending conductors on the support layer 14. Preferably the bores used for interruption purposes, i.e., bore 22 are filled with a dielectric material 23.

Figure 3:
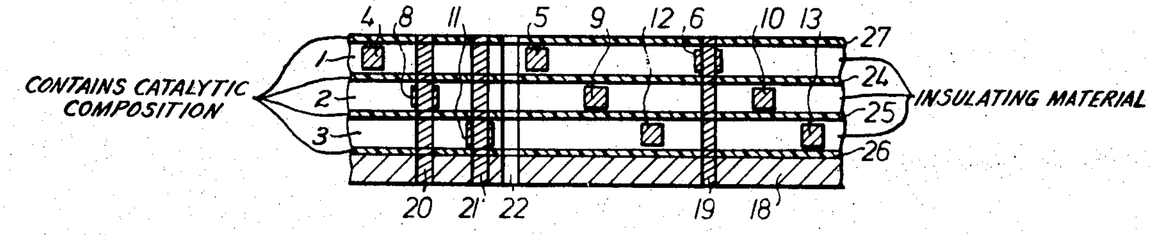
FIG. 3 is a side elevation view, partially in section, of a modified embodiment of a multilayer conductor sheet according to the invention.

Referring now to FIG. 3, there is shown a modification of the structure of FIGS. 1 and 2. As shown in the figures, intermediate layers of insulating material 24–26, for example of resin material, are provided between the individual layers 1–3 and 14. Preferably these layers contain or include catalysts which are released by the formation of the bores 19–22 and which sensitize the walls of the bores so that the layers may be easily metallized.

The catalytic compositions comprise and adhesive resin base having dispersed throughout finely divided particles of an agent which is receptive to electrolessly deposited copper. The receptive agents dispersed throughout the resin base may be finely divided metal or metal oxides, such as copper, zinc, copper oxides. The base materials having incorporated therein the active agent for reception of the electroless copper deposit may be impregnated laminates of paper or cloth or Fiberglas. The resin impregnant for such laminates include phenolics, epoxys, polyesters and the like.

To aid in the adhesion of an external conductor pattern, e.g., the connection to the contacts etc., to the multilayer conductor sheet, one or more surfaces of the multilayer conductor sheet may be coated with a layer of catalytic material, e.g., layer 27, similar to that contained in the intermediate layers 24–26.

It will be understood that the above description of the present invention is susceptible to various modifications, changes and adaptations, and the same are intended to be comprehended within the meaning and range of equivalents of the appended claims.

I claim:

1. A flat multilayer conductor sheet comprising:

a plurality of parallel layers of resin impregnated material bonded together to form a multilayer structure, at least one of said layers of material being provided with a plurality of parallel conductors extending in a first direction, and a plurality of other of said layers each being provided with a plurality of parallel conductors extending in a direction transverse to said first direction, all of said conductors which extend in said direction transverse to said first direction being parallel to one another, and being arranged such that they do not overlie one another and form a pattern of consecutive conductors, whereby a grid pattern is formed between the transversely extending conductors of said layers.

2. A multilayer conductor sheet as defined in claim 1 wherein the conductors are insulated from one another by a dielectric material in said layers.

3. A multilayer conductor sheet as defined in claim 1 wherein said layers contain insulated conductors.

4. A multilayer conductor sheet as defined in claim 1 wherein an intermediate layer of insulating material is disposed between at least two of said layers with conductors.

5. A multilayer conductor sheet as defined in claim 1 wherein said arrangement is provided with at least one bore which extends through said layers and through a pair of conductors extending in directions transverse to one another, whereby, electrical contact may be provided between said pair of conductors via said bore.

6. A multilayer conductor sheet as defined in claim 5 wherein catalysts are impregnated in said layers which are released by the formation of said bore and sensitizes the walls of said bore so that a metal contact may be deposited therein without requiring the use of electric current.

7. A multilayer conductor sheet as defined in claim 5 wherein an intermediate layer of insulating material is disposed between at least two of said layers provided with conductors, and wherein said intermediate layer contains catalysts which, are released by the formation of said bore and sensitized the walls of said bore so that a metal contact may be deposited therein without requiring the use of electric current.

8. A multilayer conductor sheet as defined in claim 1 wherein the said surface of said arrangement is coated with a layer of material containing catalysts which provide good adhesion between the material of said layers and an external metal conductor pattern.

9. A multilayer conductor sheet as defined in claim 1 wherein the spacing between said parallel conductors is such that a vertical bore can be formed through said layers which will interrupt only one of said conductors.

10. A multilayer conductor sheet as defined in claim 9 wherein said sheet is provided with at least one bore which interrupts at least one of said conductors.

11. A multilayer conductor sheet as defined in claim 10 wherein said bores which interrupt said conductors are filled with a dielectric material.

* * * * *